United States Patent
Song et al.

(10) Patent No.: US 6,825,511 B2
(45) Date of Patent: Nov. 30, 2004

(54) SEMICONDUCTOR DEVICE HAVING FUSE CIRCUIT ON CELL REGION AND METHOD OF FABRICATING THE SAME

(75) Inventors: Young-Hee Song, Kyungki-do (KR); Ill-Heung Choi, Chungcheongnam-do (KR); Min-Young Son, Kyungki-do (KR); Min-Sang Park, Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/269,202

(22) Filed: Oct. 10, 2002

(65) Prior Publication Data

US 2003/0085446 A1 May 8, 2003

(30) Foreign Application Priority Data

Nov. 2, 2001 (KR) ........................................ 2001-68159

(51) Int. Cl.[7] ............................................. H01L 27/10
(52) U.S. Cl. ........................................ 257/209; 257/529
(58) Field of Search ................................. 438/131, 132, 438/215, 281, 329, 333, 467, 600, 601; 257/50, 209, 528, 529, 530

(56) References Cited

U.S. PATENT DOCUMENTS 5,731,624 A * 3/1998 Motsiff et al. ............... 257/529
6,574,763 B1 * 6/2003 Bertin et al. ................. 714/738

FOREIGN PATENT DOCUMENTS

KR 2001-37795 10/1999

OTHER PUBLICATIONS

English language abstract of Korean Patent Publication No. 2001-37795, published Oct. 20, 1999.

* cited by examiner

*Primary Examiner*—Hoai Pham
(74) *Attorney, Agent, or Firm*—Marger Johnson & McCollom, P.C.

(57) ABSTRACT

A semiconductor device, capable of improving integration density and solving problems that may occur in a laser repair process, and a method of fabricating the same are provided. A fuse circuit is formed in a cell region, not in a peripheral region, and thus it is possible to reduce the size of a semiconductor chip.

38 Claims, 7 Drawing Sheets

SEMICONDUCTOR DEVICE HAVING FUSE CIRCUIT ON CELL REGION AND METHOD OF FABRICATING THE SAME

This application claims priority from Korean Patent Application No. 2001-0068159, filed on Nov. 2, 2001, the contents of which are incorporated herein by this reference in their entirety.

BACKGROUND OF THE INVENTION

1. Field of the Invention

The present invention relates to semiconductor devices. More particularly, this invention relates to a semiconductor device having a redundancy circuit and a fuse circuit, as well as to methods of fabricating the same.

2. Description of the Related Art

As design rules of semiconductor memory devices decrease, high-density memory devices (e.g., 256 MB Dynamic Random Access Memories (DRAMs)) have become popular. In high-density memory devices, a memory device will not operate properly even if only one of its many memory cells is defective. Unfortunately, however, as the integration density of DRAMs increases, the probability of a defect occurring in the memory cells also increases. This can therefore significantly decrease the total yield of semiconductor device fabrication, even if only a few memory cells turn out to be defective. In a conventional method of increasing the yield, defective cells are replaced using a redundant memory cell circuit included in each of the semiconductor devices.

This method has been applied primarily to DRAMS (e.g., 64–256 MB DRAMs). According to this method, if main cells are defective, addresses allotted to the defective main cells are replaced by addresses (e.g., column/row lines) corresponding to redundant cells in a redundant memory cell circuit. Accordingly, when a wafer fabrication process is completed, an electrical test is used to distinguish between defective memory cells and normal main cells. The addresses of the defective memory cells are then replaced with addresses of replacement cells in the redundant memory cell circuit through a repair process, such as a laser repair process, for example. The laser repair process is performed by cutting fuses in a fuse circuit that connects main cells to redundant cells.

Accordingly, during operation, when an address corresponding to a defective cell is input, the address of the defective cell is replaced with a preliminary address in the redundant memory cell circuit. The semiconductor memory device can thereby operate properly despite the presence of defective memory cells.

Figure 1:
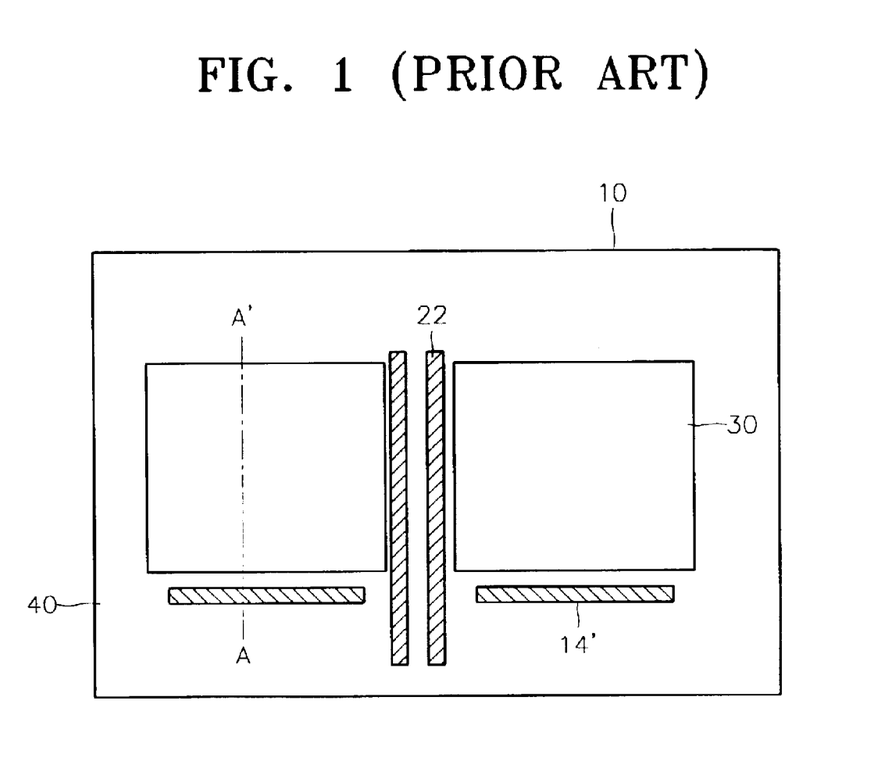
FIG. 1 is a schematic plan view of a conventional semiconductor device having a fuse circuit.

FIG. 1 is a schematic diagram of a conventional semiconductor device having a fuse circuit. Referring to FIG. 1, a general memory circuit (e.g., DRAM) of the conventional semiconductor device, is divided into a cell region 30 and a peripheral region 40. Memory cells are formed in the cell region 30. The number of memory cells corresponds to the storage capacity of the memory circuit. A decoder is used to operate unit cells in the cell region 30. A buffer circuit, a redundancy circuit, and a fuse circuit 14' are formed in the peripheral region 40. The peripheral region 40 includes all of the regions of the memory circuit except for the cell region 30.

Figure 2:
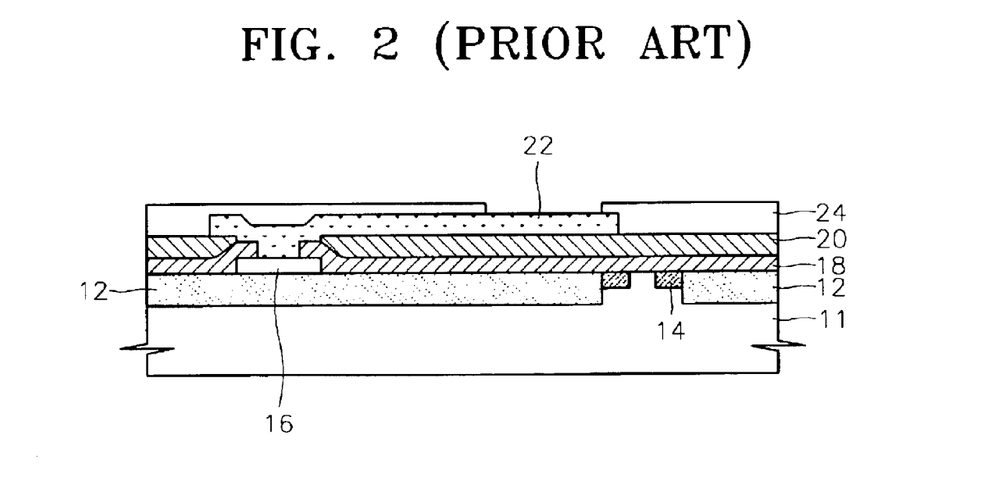
FIG. 2 is a cross-sectional view of a conventional semiconductor device having a fuse circuit.

A pad redistribution pattern 22 is a conductive pattern used to redistribute a pad 16 formed under a passivation layer 18 of a semiconductor device. The pad redistribution pattern 22 is used in manufacturing a wafer level package (WLP). FIG. 2 is a cross-sectional view of a conventional semiconductor device used to form a WLP having a fuse circuit. Referring to FIG. 2, a DRAM device having a conventional fuse circuit is manufactured by forming a lower structure 12 on a semiconductor substrate 11. The lower structure 12 can be a DRAM circuit having a cell region and a peripheral region. The lower structure 12 includes a gate electrode, a bit line, a capacitor, and a metal wiring layer (not shown). A pad 16 is formed to provide an external contact for the DRAM circuit. A passivation layer 18 and a first insulating layer 20 are sequentially formed on the resulting structure and are patterned to expose the pad 16.

A pad redistribution pattern 22 is formed on the first insulating layer 20 and is connected to the pad 16. A second insulating layer 24 is then formed to expose a predetermined portion of the pad redistribution pattern 22, to which an external connection terminal can be attached. The external connection terminal used in the WLP process can, for example, be a conductive bump, e.g., a solder ball, or any other suitable external connection terminals.

Unfortunately, conventional semiconductor devices with fuse circuits have several problems. Among others, since a fuse circuit 14 occupies a predetermined area in a peripheral region of a semiconductor memory device, there is a limit to the amount by which the integration density of the semiconductor memory device can be increased. In addition, when manufacturing a small outline package (SOP) or a quad flat package (QFP), there is no need to form the first insulating layer 20, the pad redistribution pattern 22, and the second insulating layer 24 on the passivation layer 18. Accordingly, for these devices, it is not difficult to cut a fuse pattern 14 under the passivation layer 18 using laser beams. When manufacturing a WLP, however, the first insulating layer 20, pad redistribution pattern 22, and the second insulating layer 24 are formed on the passivation layer 18. There is accordingly a much greater distance between the top surface of the semiconductor memory device, to which laser beams are applied, and the fuse pattern 14. Problems may therefore occur during a laser repair process. For example, the laser beams applied to the top surface of the semiconductor memory device may be out of focus. To correct this problem, the width of the fuse pattern 14 is increased. This decreases the integration density of the semiconductor memory device.

SUMMARY OF THE INVENTION

The present invention provides a semiconductor device that can be highly integrated easily and can solve problems occurring in a laser repair process.

According to one embodiment of the present invention, a semiconductor device includes a semiconductor substrate, a cell region formed on a predetermined portion of the semiconductor substrate, a peripheral region formed on the other portion of the semiconductor substrate, and a fuse circuit formed in the cell region.

According to the present invention, since a fuse circuit is installed in not a peripheral region but a cell region of a semiconductor memory device having a redundancy circuit and the fuse circuit, it is possible to increase the integration density of the semiconductor memory device. In addition, according to one embodiment of the present invention, since the fuse circuit is formed overlying a passivation layer not under the passivation layer, it reduces problems that may occur in cutting the fuse circuit.

BRIEF DESCRIPTION OF THE DRAWINGS

The foregoing objects and advantages of the present invention will become more readily apparent through the following detailed description of preferred embodiments thereof, made with reference to the attached drawings, in which.

DETAILED DESCRIPTION OF PREFERRED EMBODIMENTS

The present invention will now be described more fully with reference to various preferred embodiments of the invention as shown in the accompanying drawings. It should be noted, however, that the principles of the present invention may be embodied in many different forms and should not be construed as being limited to the particular embodiments set forth herein. Rather, these embodiments are provided simply by way of example, and not of limitation.

Accordingly, various changes in form and details may be made to the described embodiments without departing from the spirit and scope of the invention as defined by the appended claims. Among others, the principles of the invention apply to many types of semiconductor devices and are not limited to any particular type of device, such as a DRAM. The present invention can, for instance, be applied to a ferroelectric random access memory (FRAM), a static random access memory (SRAM), and a non-volatile memory (NVM), as well as a DRAM. In addition, although a solder ball can be used to provide an external connection terminal, other suitable external connection could also be used.

Figure 3:
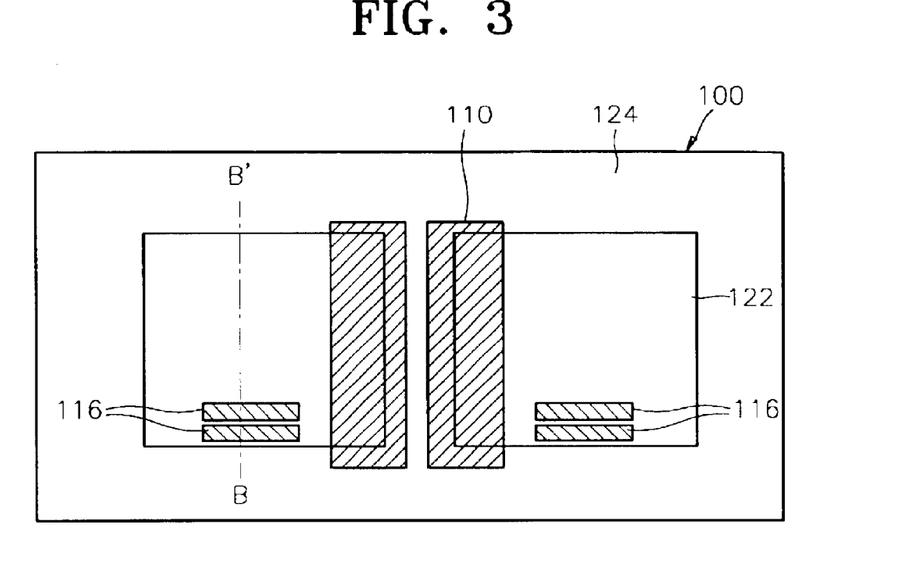
FIG. 3 is a schematic plan view of a semiconductor device having a fuse circuit according to one embodiment of the present invention.

FIG. 3 illustrates a semiconductor device 100 having a fuse circuit 116 formed therein according to an embodiment of the present invention. Referring to FIG. 3, unlike in the prior art in which a fuse circuit is formed in a peripheral region, a fuse circuit 116 according to this embodiment is formed in a cell region 122. A pad redistribution pattern 110 can also be primarily located in the cell region 122.

Figure 4:
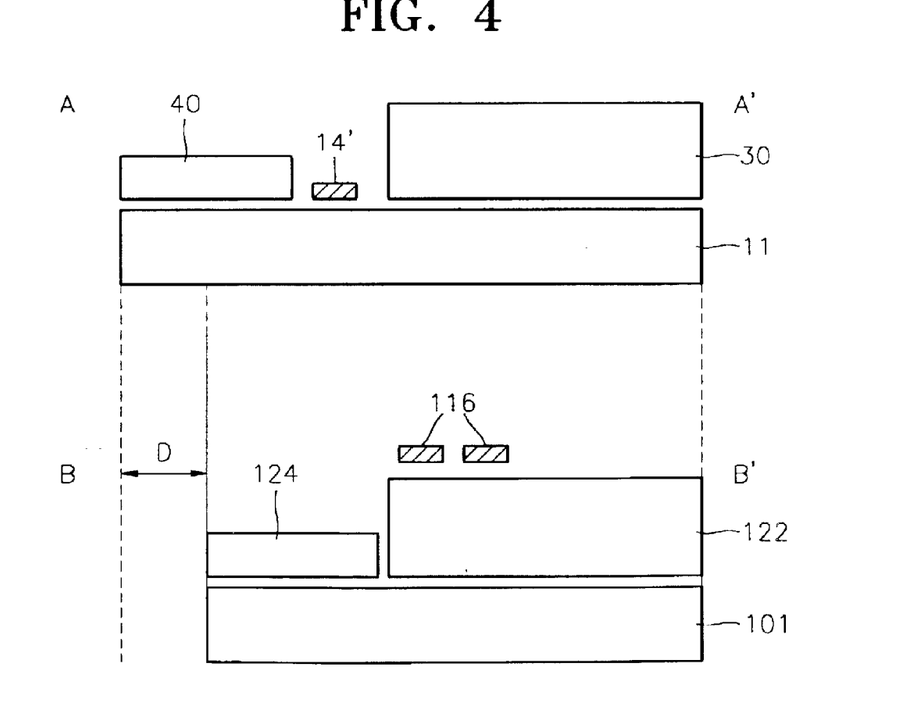
FIG. 4 provides schematic cross-sectional views a conventional semiconductor device (taken along line A-A' of FIG. 1) and a semiconductor device constructed according to principles of the present invention (taken along line B-B' of FIG. 3) to provide a size comparison.

FIG. 4 includes a cross-sectional view of a conventional semiconductor device 10, taken along line A-A' of FIG. 1, and a cross-sectional view of a semiconductor device 100 embodying principles of the present invention, taken along line B-B' of FIG. 3. These cross-sectional views provide a comparison between the integration densities of the two devices. As can be seen from FIG. 4, by moving the fuse circuit 116 from the peripheral region 124 to the cell region 122, the area of a semiconductor device can be reduced by an amount D. The distance D corresponds to a reduced amount of area on the surface of the semiconductor device, and results in an increase in the number of chips that can be arranged on one wafer.

Referring to FIGS. 3 and 4, the semiconductor device 100 having a redundant circuit and a fuse circuit 116 according to an embodiment of the present invention includes a semiconductor substrate 101 having a cell region 122 and a peripheral region 124 formed on predetermined areas thereof. A fuse circuit 116 is formed in the cell region 122.

FIGS. 5 through 8 are cross-sectional views illustrating a method of fabricating a semiconductor device 100 having a fuse circuit 116 formed in a cell region 122 thereof, according to one embodiment of the present invention. In addition, as shown in FIGS. 5 through 8, a pad redistribution pattern 110 can convert a center-type bond pad into a peripheral bond pad.

Figure 5:
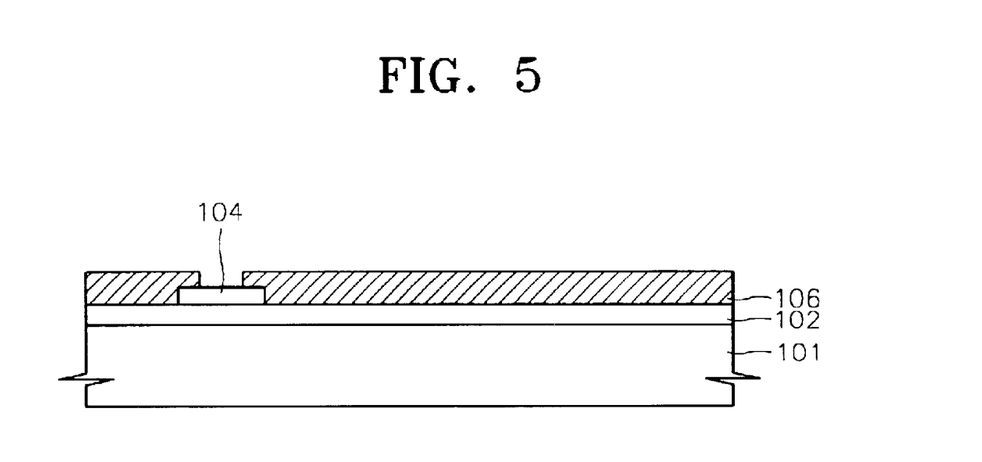
FIGS. 5 through 8 are cross-sectional views of the semiconductor device of FIG. 3, illustrating a method of fabricating the same.

Referring to FIG. 5, a lower structure 102, for example, a DRAM circuit unit, which includes a field oxide layer, a gate electrode, a bit line, a capacitor, and a metal wiring layer, (not shown for simplicity) is formed in a peripheral region and a cell region of a semiconductor substrate 101. Next, a passivation layer 106 is deposited on the lower structure 102 and is patterned to expose a pad 104.

Figure 6:
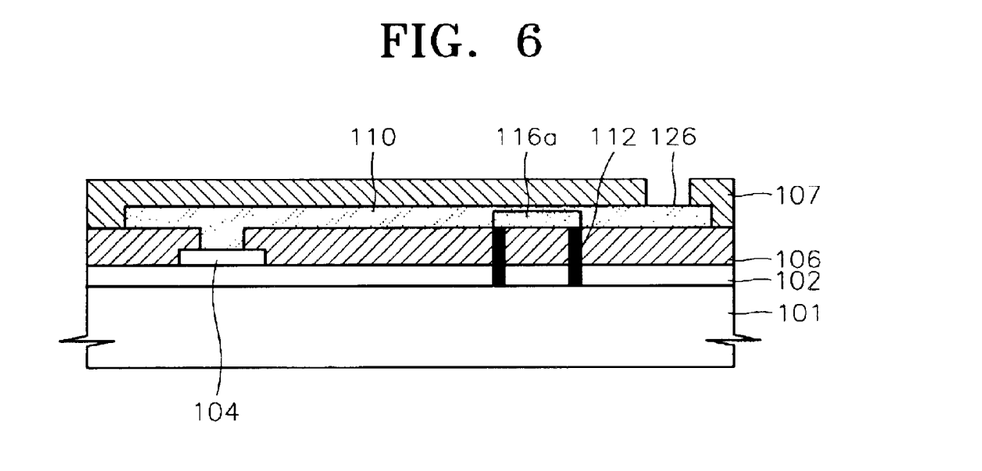

Referring to FIG. 6, a conductive layer, used to form a pad redistribution pattern 110, is formed on the passivation layer 106. The conductive layer can be chrome (Cr), copper (Cu), nickel (Ni), gold (Au), aluminium (Al), titanium (Ti), and/or titanium nitride (TiN). Next, the conductive layer is patterned to form the pad redistribution pattern 110 and a fuse pattern 116a.

The pad redistribution pattern 110 and the fuse pattern 116a can be formed on substantially the same plane but preferably do not overlap with each other. In this embodiment, the pad redistribution pattern 110 converts a center-type bond pad into a peripheral bond pad. The fuse pattern 116 is preferably formed in the cell region, not in the peripheral region. Another passivation layer 107 is preferably formed on the semiconductor substrate 101, after the pad redistribution pattern 110 has been formed. This passivation layer 107 can be patterned to expose a peripheral bond pad 126.

Figure 7:
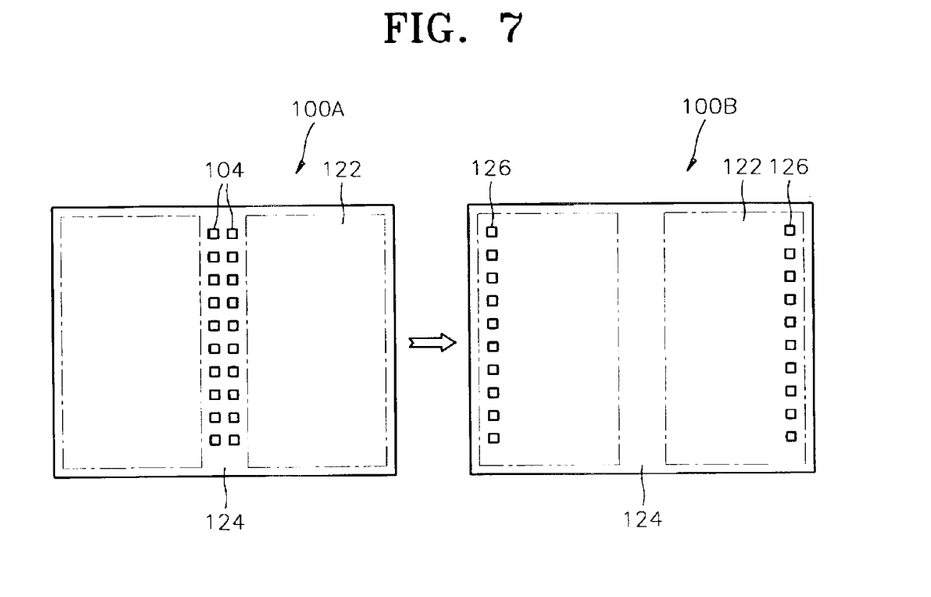

FIG. 7 illustrates the conversion of the center-type bond pads to the peripheral bond pads. Referring to FIG. 7, the semiconductor device 100A having center-type bond pads 104 is converted to a device 100B having peripheral bond pads 126, using the pad redistribution pattern. In other words, the semiconductor device 100A does not include the pad redistribution pattern 110, while the device 100B has been converted into a peripheral bond pad device from the center-type bond pad device 100A by forming a pad redistribution pattern.

Figure 8:
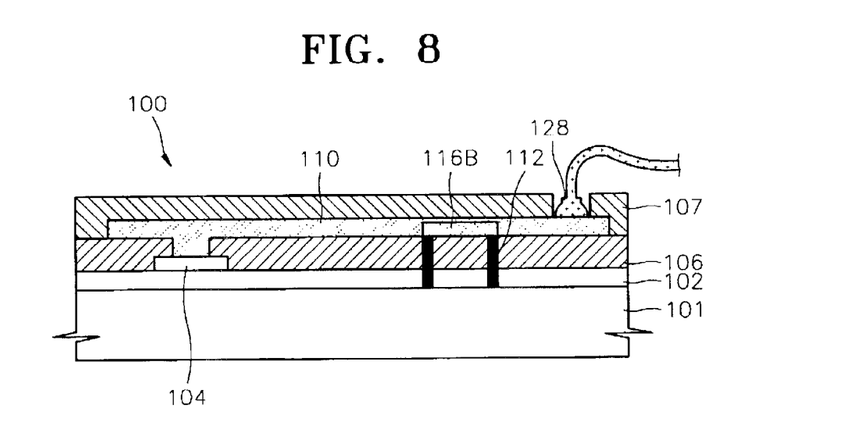

Referring to FIG. 8, a ball bond 128 is formed using wires, for example, gold wires, on the exposed peripheral bond pad 126 to permit external electrical connection of the semiconductor device 100. The passivation layers 106 and 107 may be formed as a single layer or a multi-layer and may also be embodied in different forms.

FIGS. 9 through 12 are cross-sectional views of a semiconductor device 100C having a fuse circuit formed in cell region at various steps during its fabrication. These figures illustrate a method of fabricating a semiconductor device according to another embodiment of the present invention. In this embodiment, a pad redistribution pattern is introduced to form a solder ball pad.

Figure 9:
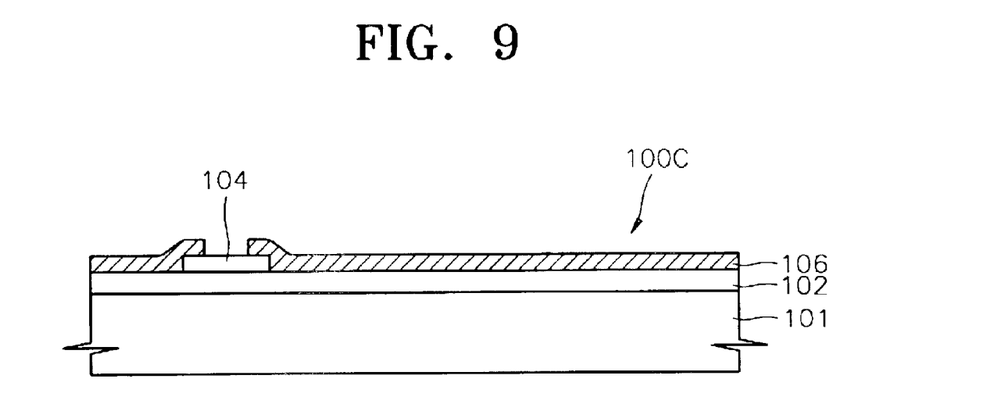
FIGS. 9 through 12 are cross-sectional views of a semiconductor device constructed according to another embodiment of the invention, illustrating a method of fabricating the same.

Referring to FIG. 9, a lower structure 102, for example, a DRAM circuit unit, is formed in a peripheral region and a cell region of the semiconductor device 100C on a substrate 101. The lower structure 102 preferably includes a field oxide layer, a gate electrode, a bit line, a capacitor, and a metal wiring layer. Next, a passivation layer 106 is deposited on the semiconductor substrate 101 over the lower structure 102 and is patterned to expose a pad 104.

Figure 10:
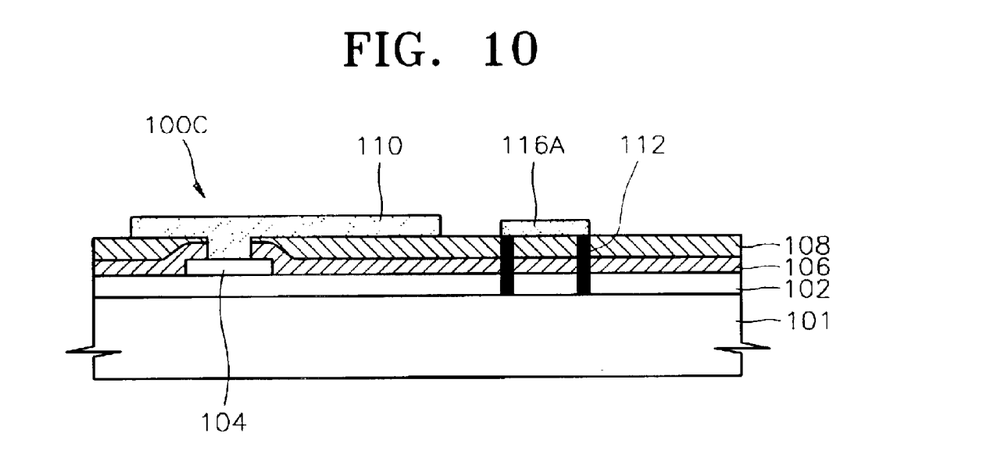

Referring to FIG. 10, a first insulating layer 108 is formed on the passivation layer 106. The first insulating layer 108 may be a single layer or a multi-layer made of a high-density plasma (HDP) oxide layer, a benzicyclobutene (BCB) layer, a polybenzoxazole (PBO) layer, and/or a polyimide layer, for example.

Next, a patterned photoresist layer is formed on the first insulating layer 108. The first insulating layer 108 and the passivation layer 106 are patterned by photolithography and etching to form a via hole therethrough to be connected to a bit line or word line. The via hole is then filled with a conductive material, thereby forming a plug 112.

A conductive layer is formed on the resulting structure. The conductive layer is patterned to form the pad redistribution pattern 110 and the fuse pattern 116a simultaneously in the same process. The conductive layer may be a single layer or a multi-layer containing tungsten (W), chrome (Cr), titanium (Ti), and/or titanium tungsten (TiW).

In the prior art, a fuse circuit, including the fuse pattern 116a, is formed by extending bit line/word line wiring layers of the lower structure 102 to a peripheral region. In the foregoing embodiments of the present invention, however, the fuse pattern 116a is formed in a cell region.

Figure 11:
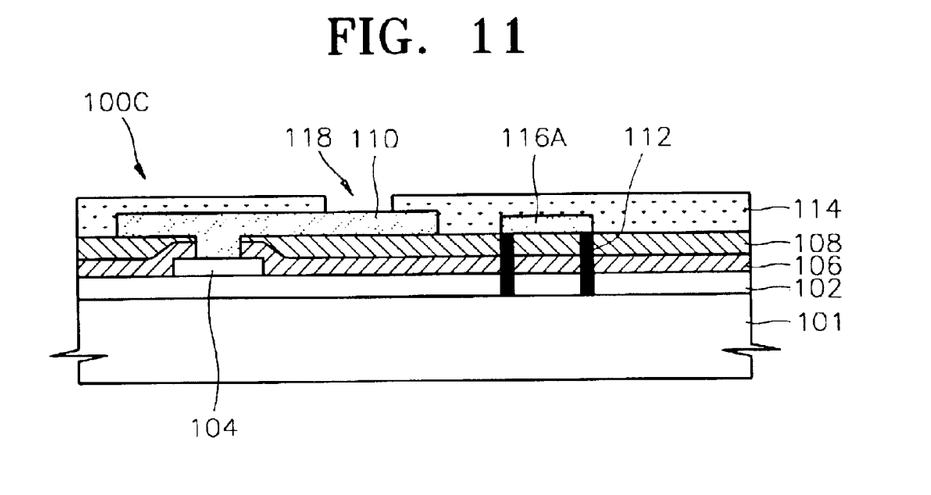

Referring to FIG. 11, a second insulating layer 114 is formed on the first insulating layer 108. The second insulating layer 114 may be a single layer or a multi-layer containing a polyimide, for example. A patterned photoresist layer is then formed on the second insulating layer 114. The second insulating layer is then patterned by photolithography and etching to form a solder ball pad 118, through which a predetermined portion of the pad redistribution pattern 110 is exposed.

Figure 12:
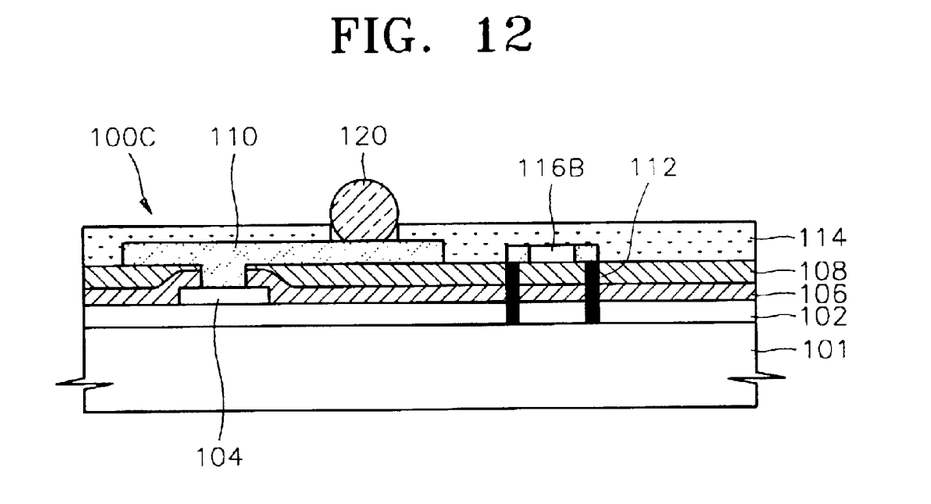

Referring to FIG. 12, a laser repair process can then be performed on the resulting structure, including the semiconductor substrate 101, on which the solder ball pad 118 has been formed, in which a fuse pattern 116b is selectively cut. In this process, cells in a cell region that are identified as defective cells through an electrical test can be replaced by redundant memory cells in a redundancy circuit. An external connection terminal, for example, a conductive bump, e.g., a solder ball 120, can then be attached to the resulting structure after the laser repair process is completed. Other external connections can be used instead of the solder ball 120.

In the prior art, since the fuse pattern is arranged under the passivation layer 106, it is difficult to selectively cut the fuse pattern by irridating laser beams to the fuse pattern through the passivation layer 106. This is because the laser beams may be out of focus. Thus, the width of the fuse pattern 116b needs to be increased. According to principles of the present invention, however, because the fuse pattern 116b is formed close to the top surface of a semiconductor device, the distance traveled by the laser beams to reach the fuse pattern 116b can be reduced. Thus, the problem of the prior art, in which laser beams are out of focus, can be solved. In addition, since the fuse pattern 116b is formed not in a peripheral region but rather in a cell region, the integration density of a semiconductor device can be increased.

Figure 13:
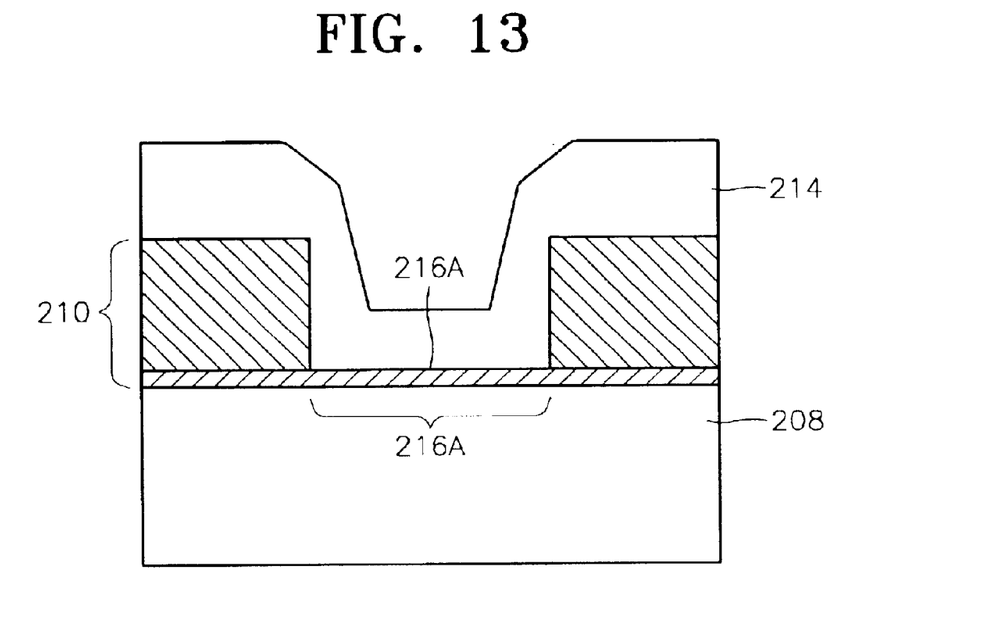
FIGS. 13 and 14 are cross-sectional views of a fuse pattern illustrating alternative fuse circuit embodiments, according to further principles of the present invention.
Figure 14:
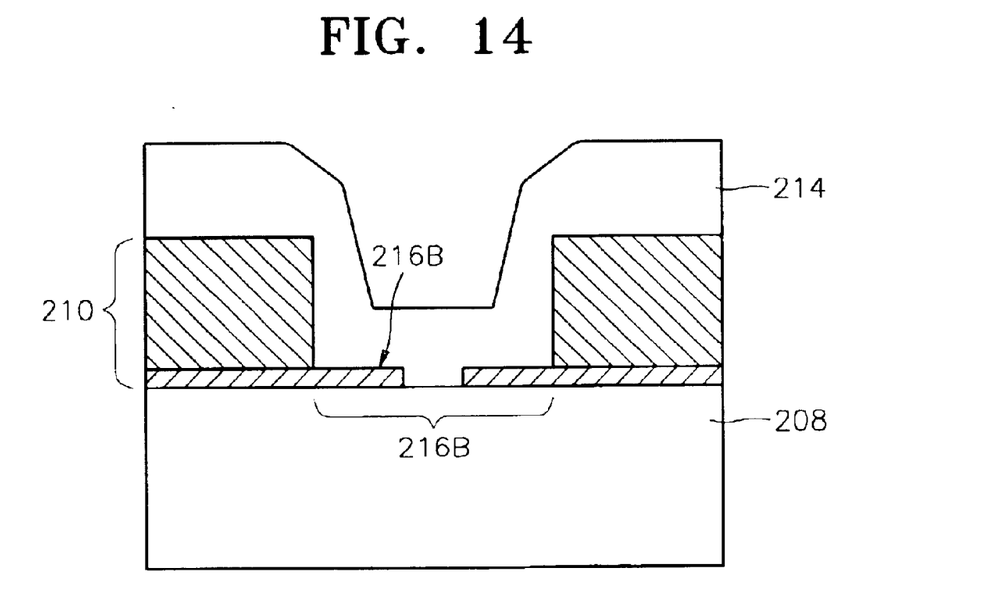

FIGS. 13 and 14 are cross-sectional views illustrating alternative embodiments of a fuse pattern of a fuse circuit according to another aspect of the present invention. In the previously described embodiments, the fuse pattern 116b is formed having almost the same thickness as the pad redistribution pattern 110. In this alternative embodiment, however, a pad redistribution pattern 210 is formed of chrome (Cr), copper (Cu), nickel (Ni), gold (Au), aluminium (Al), titanium (Ti), and/or titanium nitride (TiN) as a multi-layer on a first insulating layer 208. A fuse pattern 216A is then etched so that the thickness of the fuse pattern 216A is substantially less than the thickness of the pad redistribution pattern 210. Accordingly, it becomes easier to cut the fuse pattern 216A using laser beams. It is thereby possible to increase the yield of a semiconductor device in a laser repair process. The fuse pattern 216A having a smaller thickness than the pad redistribution pattern 210 may be formed of chrome (Cr), copper (Cu), nickel (Ni), gold (Au), aluminium (Al), titanium (Ti), and/or titanium nitride (TiN) in a single layer or a multi-layer. A second insulating layer 214 can also be provided.

As described above, according to various embodiments of the present invention, a chip is designed so that a fuse circuit can be located in a cell region, not a peripheral region, to increase the integration density of a semiconductor memory chip. In addition, by forming the fuse circuit on a passivation layer, the problem of the prior art, in which laser beams applied in a laser repair process to cut a fuse pattern are out of focus, can be solved. Furthermore, because the fuse pattern is formed to have a smaller thickness than a pad redistribution pattern through etching, it is possible to easily perform a fusing process.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A semiconductor device comprising:
   a semiconductor substrate having a cell region and a peripheral region; and
   a fuse circuit formed in the cell region; and
   a pad redistribution pattern, wherein the fuse circuit is disposed on substantially the same plane as the pad redistribution pattern.

2. The semiconductor device of claim 1, wherein circuits formed in the cell region and the peripheral region perform the functions of a dynamic random access memory (DRAM).

3. A semiconductor device comprising:
   a semiconductor substrate;
   a lower structure formed on the semiconductor substrate, the lower structure having a pad;
   a first passivation layer formed on the lower structure, the passivation layer having an opening therein to expose the pad;
   a pad redistribution pattern formed on the passivation layer and electrically connected to the pad;
   a fuse pattern formed on substantially the same plane as the pad redistribution pattern and electrically connected to the lower structure; and a second passivation layer formed overlying the fuse pattern, the second passivation layer having an opening therein to expose a portion of the pad redistribution pattern and cover the other portions of the pad redistribution pattern and the fuse pattern.

4. The semiconductor device of claim 3, the fuse pattern is electrically connected to the lower structure via a plug formed through the first passivation layer.

5. The semiconductor device of claim 3, further comprising an external connection terminal connected to the exposed portion of the pad redistribution pattern.

6. The semiconductor device of claim 3, wherein the pad redistribution pattern is used to convert a center-type bond pad into a peripheral bond pad.

7. The semiconductor device of claim 3, wherein the external connection terminal is a gold wire connected to the pad redistribution pattern by a wire bonding process.

8. The semiconductor device of claim 3, wherein the lower structure is divided into a cell region and a peripheral region and is a circuit unit for performing the functions of a DRAM.

9. The semiconductor device of claim 3, wherein the fuse pattern is formed in the cell region.

10. A semiconductor device comprising:
a semiconductor substrate;
a lower structure formed on the semiconductor substrate, the lower structure having a pad;
a passivation layer formed on the lower structure;
a first insulating layer formed on the passivation layer, wherein the passivation layer and the first insulating layer having an opening therein to expose the pad;
a pad redistribution pattern formed on the first insulating layer and electrically connected to the pad;
a fuse pattern formed on substantially the same plane as the pad redistribution pattern and electrically connected to the lower structure; and
a second insulating layer formed to expose a portion of the pad redistribution pattern and cover the other portions of the pad redistribution pattern and the fuse pattern.

11. The semiconductor device of claim 10, further comprising an external connection terminal connected to the exposed portion of the pad redistribution pattern.

12. The semiconductor device of claim 10, wherein the pad redistribution pattern is electrically connected to the lower structure via a plug formed through the passivation layer and the first insulating layer.

13. The semiconductor device of claim 12, wherein the pad plug is connected to a bit line pattern or a word line pattern.

14. The semiconductor device of claim 10, wherein the lower structure is divided into a cell region and a peripheral region and is a circuit unit for performing the functions of a DRAM.

15. The semiconductor device of claim 10, wherein the pad redistribution pattern comprises a plurality of conductive layers.

16. semiconductor device of claim 15, wherein each of the conductive layers is formed of one selected from the group consisting of chrome (Cr), copper (Cu), nickel (Ni), gold (Au), aluminum (Al), titanium (Ti), and titanium nitride (TIN).

17. The semiconductor device of claim 10, wherein the fuse pattern is formed in the cell region.

18. The semiconductor device of claim 10, wherein the first insulating layer is a single layer or a multi-layer formed of one selected from the group consisting of a high-density plasma (HDP) oxide, benzocyclobutene (BCB), polybenzoxazole (PBO). a polyimide, and combinations thereof.

19. The semiconductor device of claim 10, wherein the second insulating layer is a single layer or a multi-layer containing a polyimide.

20. The semiconductor device of claim 10, wherein the fuse pattern is a single layer or a multi-layer formed by etching a portion of the pad redistribution pattern.

21. The semiconductor device of claim 10, the fuse pattern is a single layer or a multi-layer formed of one selected from among tungsten (W), chrome (Cr), titanium (Ti), titanium tungsten (TiW), and combinations thereof.

22. A semiconductor device comprising:
a semiconductor substrate having a chip pad;
a fuse circuit overlying the semiconductor substrate;
a pad redistribution pattern connected to the chip pad, the pad redistribution pattern having a bond pad; and
a passivation layer overlying the pad redistribution pattern, the passivation layer having an opening that exposes the bond pad,
wherein the fuse circuit is disposed on substantially the same plane as the pad redistribution pattern.

23. The semiconductor device of claim 22, wherein the pad redistribution pattern and the fuse circuit do not overlap with each other.

24. The semiconductor of claim 22, wherein the fuse circuit comprises a laser fuse.

25. The semiconductor device of claim 22, further comprising an external connection terminal attached to the exposed bond pad.

26. The semiconductor device of claim 25, wherein the external connectional terminal comprises a ball bond.

27. A semiconductor device comprising:
a semiconductor substrate;
a lower structure formed on the semiconductor substrate, the lower structure having a pad;
a first passivation layer formed on the lower structure, the first passivation layer having an opening therein to expose the pad; and
a fuse pattern located above the passivation layer and electrically connected to the lower structure.

28. The semiconductor device of claim 27, further comprising a second passivation layer overlying the fuse pattern.

29. The semiconductor device of claim 27, wherein the semiconductor substrate has a cell region and a peripheral region, and wherein the fuse pattern is formed in the cell region.

30. The semiconductor device of claim 29, wherein circuits formed in the cell region and the peripheral region perform the functions of a dynamic random access memory (DRAM).

31. The semiconductor device of claim 27, further comprising an external connection terminal connected to the exposed portion of the pad redistribution pattern.

32. The semiconductor device of claim 27, further comprising a pad redistribution pattern formed on the first passivation layer, wherein the pad redistribution pattern is electrically connected to the lower structure via a plug formed through the first passivation layer.

33. The semiconductor device of claim 32, wherein the plug is connected to a bit line pattern or a word line pattern.

34. The semiconductor device of claim 32, wherein the pad redistribution pattern comprises a plurality of conductive layers.

35. The semiconductor device of claim 34, wherein the conductive layers comprise one selected from the group consisting of chrome (Cr), copper (Cu), nickel (Ni), gold (Au), aluminum (Al), titanium (Ti), and titanium nitride (TiN).

36. The semiconductor device of claim 27, wherein the fuse pattern is a single layer or a multi-layer formed by etching a portion of the pad redistribution pattern.

37. The semiconductor device of claim 27, wherein the fuse pattern is a single layer or a multi-layer formed of one selected from among tungsten (W), chrome (Cr), titanium (Ti), titanium tungsten (TiW), and combinations thereof.

38. The semiconductor device of claim 27, wherein the first passivation layer comprises a single layer or a multi-layer.

* * * * *

UNITED STATES PATENT AND TRADEMARK OFFICE
CERTIFICATE OF CORRECTION

PATENT NO. : 6,825,511 B2
DATED : November 30, 2004
INVENTOR(S) : Song et al.

It is certified that error appears in the above-identified patent and that said Letters Patent is hereby corrected as shown below:

Column 7,
Line 6, replace "claim 3, the fuse pattern" with -- claim 3, wherein the fuse pattern --.
Line 58, replace "16. semiconductor device" with -- 16. The semiconductor device --.
Line 62, replace "(TIN)." with -- (TiN). --.

Column 8,
Line 2, replace "(PBO). a polyimide" with -- (PBO), a polyimide --.
Line 9, replace "claim 10, the fuse" with -- claim 10, wherein the fuse --.
Line 27, replace "semiconductor of claim 22" with -- semiconductor device of claim 22 --.

Signed and Sealed this

Twenty-eighth Day of February, 2006

JON W. DUDAS
*Director of the United States Patent and Trademark Office*